United States Patent [19]
Shor et al.

[11] Patent Number: 5,376,241
[45] Date of Patent: Dec. 27, 1994

[54] FABRICATING POROUS SILICON CARBIDE

[75] Inventors: Joseph S. Shor, Flushing, N.Y.;
Anthony D. Kurtz, Teaneck, N.Y.

[73] Assignee: Kulite Semiconductor Products, Inc., Leonia, N.J.

[21] Appl. No.: 159,375

[22] Filed: Nov. 30, 1993

Related U.S. Application Data

[62] Division of Ser. No. 957,519, Oct. 6, 1992, Pat. No. 5,298,767.

[51] Int. Cl.$^5$ .............................................. C25F 3/12
[52] U.S. Cl. ............................ 204/129.3; 204/129.55; 204/129.75
[58] Field of Search ............ 204/129.55, 129.3, 129.75, 204/129.8, 129.1

[56] References Cited

U.S. PATENT DOCUMENTS

| 3,254,280 | 5/1966 | Wallace | 204/129.55 X |
| 4,028,149 | 6/1977 | Deines et al. | 204/129.3 X |
| 5,227,034 | 7/1993 | Stein et al. | 204/129.1 |

Primary Examiner—Donald R. Valentine
Attorney, Agent, or Firm—Arthur L. Plevy

[57] ABSTRACT

The formation of porous SiC occurs under electrochemical anodization. A sample of SiC is contacted electrically with nickel and placed into an electrochemical cell which cell includes a counter electrode and a reference electrode. The sample is encapsulated so that only a bare semiconductor surface is exposed. The electrochemical cell is filled with an HF electrolyte which dissolves the SiC electrochemically. A potential is applied to the semiconductor and UV light illuminates the surface of the semiconductor. By controlling the light intensity, the potential and the doping level, a porous layer is formed in the semiconductor and thus one produces porous SiC.

11 Claims, 3 Drawing Sheets

FABRICATING POROUS SILICON CARBIDE

This invention is the subject matter of a NASA contract, contract No. NAS-3-26599 and the U.S. Government may have rights thereunder.

This is a division, of application Ser. No. 07/957,519, filed Oct. 6, 1992 Ser. No. 07/957,519 now U.S. Pat. No. 5,298,767 has been allowed. Notice of Allowance dated Nov. 10, 1993.

RELATED APPLICATIONS

The assignee herein, Kulite Semiconductors Products is the record owner of U.S. patent application entitled "HIGH TEMPERATURE TRANSDUCERS AND METHODS OF FABRICATING THE SAME EMPLOYING SILICON CARBIDE", Ser. No. 07/694,490, filed on May 2, 1991 for Anthony D. Kurtz et al. See also U.S. patent application No. 07/777,157 filed on Oct. 16, 1991 entitled "METHOD FOR ETCHING OF SILICON CARBIDE SEMICONDUCTOR USING SELECTIVE ETCHING OF DIFFERENT CONDUCTIVITY TYPES" by J. S. Shor et al. and assigned to Kulite.

FIELD OF THE INVENTION

This invention relates to semiconductor devices in general and more particularly, to semiconductor devices which employ single crystal silicon carbide (SiC) and methods of making porous silicon carbide and single crystal silicon carbide.

BACKGROUND OF THE INVENTION

In the recent literature, there has been much interest in electrochemical processes which cause semiconductors, such as silicon, to become porous. Various articles have appeared in Applied Physics Letters and other publications relating to such devices. See for example, an article by V. Lehman and U. Gosele, Applied Physics Letters, Volume 58, Page 856 (1991). See also an article in Volume 57 of Applied Physics Letters, by L. T. Canham, Page 1046 (1990). The prior art was cognizant of the fact that in certain instances, porous silicon exhibits unique properties which are superior to those of bulk silicon. For example, high efficiency luminescence has been observed in porous silicon above the 1.1 eV band-gap of bulk material, which suggests that optical devices can be fabricated based on the use of porous silicon. Control of the pore size on the nanometer scale can allow porous materials to be used as filters in solid state chemical sensors. Furthermore, because of the large surface area inherent in porous structures, the porous semiconductors exhibit oxidation rates which are many orders of magnitude above bulk crystals. This effect can be used for selective etching of the semiconductor, since oxides are easily removed from the semiconductor surface. It also can be used to dielectrically isolate devices fabricated in the semiconductor wafer.

In any event, there are several theories for the formation mechanisms of pores in silicon. A good reference is the article by R. L. Smith and S. D. Collins appearing in the Journal of Applied Physics, Volume 8, R1 (1992). Studies seggest that the depletion regions of pores overlap, causing a carrier depletion in the interpore region, and thus the current is confined to the pore tips. In an article that appeared in the Journal of the Electrochemical Society, Volume 138, Page 3750 (1991) by X..G. Zhang, there was indicated that pore propagation is attributed to a higher electric field at the pore tips which causes dissolution to occur more rapidly through the intermediate step of silicon dioxide formation, while along the pore walls dissolution occurs through the slower process of direct dissolution. The pore wall thickness stabilizes when the depletion regions of pores overlap. In the above-cited article of Lehman et al, it is claimed that the current is confined to the pore tips due to the wider band-gap in the quantum size porous material, which causes carriers to be confined to the lower band-gap bulk material. Pore initiation may occur at asymmetrical surface sites, such as defect or impurities, or through chemical nonuniformities which occur in the initial stages of anodization of the surface.

Recent demonstrations of room temperature visible luminescence from porous silicon have generated much interest in using the material for optoelectronics. There is of course much conjecture about the mechanisms which provide the visible luminescence. Certain people claim that luminescence is caused by quantum structures (wires or dots) in the porous silicon. Presumably, these quantum structures would allow a relaxation of the momentum selection rules by confining the charges spatially, thus allowing direct band-gap transitions. Additionally, the charge confinement would increase the effective band-gap, thereby pushing it into the visible region.

Others such as C. Tsai, K. H. Li and D. S. Kinosky, et al., in an article in Applied Physics Letters, Volume 60, Page 1770 (1992) have shown that surface chemistry, specifically hydrogen termination, play an important role in the luminescence. This suggests that luminescence in porous silicon may have similar mechanisms as a-Si, which exhibits band gap widening into the visible region when hydride species are formed on the surface. It has yet to be conclusively determined whether the hydrogen termination serves only to passivate the surface and the luminescence is caused by a purely chemical effect. Nevertheless, it is very clear that microcrystals of <5 nm dimension can theoretically exhibit band gap widening and above band-gap luminescence.

There has been interest in SiC as a semiconductor material since the 1950's. Its wide band-gap, high thermal conductivity, high breakdown electric field and high melting point make SiC an excellent material for high temperature and high power applications. SiC also exhibits interesting optical properties, such as deep UV absorption, visible transparency and blue photo- and electro-luminescence. However, good quality crystals were unavailable, causing the early research efforts to stagnate. Recent developments in single crystal epilayer and boule growth have generated new interest in SiC. This has resulted in the development of SiC blue LED's, UV photodiodes and high temperature electronic components. However, due to its indirect band-gap, the efficiency of SiC optoelectronic devices is limited. Thus, research is underway to develop other wide band-gap semiconductors, such as $SiC_xAlN_y$ and III–V nitrides for optical applications. However, the crystal growth technology for these materials is still very underdeveloped. Therefore, porous SiC could be very useful, since it has potentially superior optical properties than SiC, and may benefit from the relatively mature growth and processing technology that SiC has to offer. Furthermore, SiC is very difficult to etch because of its chemical inertness. Therefore, porous SiC could also be used to pattern this material for electronic device fabrication.

There have been several reports on the electrochemical dissolution of SiC. Recently, Shor, et al. used laser assisted electrochemical etching to rapidly etch high relief structures in SiC. See an article by J. S. Shor et al, in Journal of Electrochemical Society, Volume 139, Page 143, May 22, 1992. M. M. Carrabba et al., in an article in Electrochemical Society Extended Abstracts, Volume 89-2, Page 727 (1989), reported etching diffraction gratings in n-type $\beta$- and $\alpha$-SiC at anodic potentials with a uniform light source. The fundamental electrochemical studies indicate that the presence of HF in aqueous solutions is important to etch SiC electrochemically. Glerria and Memming in Volume 65 of the Journal of Electroanl Chem., on Page 163 (1975) reported that $\alpha$-SiC dissolves in aqueous $H_2SO_4$ solutions at anodic potentials through the formation of a passivating layer, which was suggested to be $SiO_2$, since it dissolved in HF.

The present invention relates to the formation of porous SiC, a new material. It is indicated that porous SiC material itself, as well as a process to fabricate the porous SiC is provided. Porous SiC can be employed for UV light sources such as LED's and diode-lasers. Porous SiC can be utilized as a filter in chemical processes and can be used to provide heterojunction devices using the porous SiC/bulk SiC interface. As will be described, the methods employ a selective etching of bulk SiC by forming a porous layer on the surface, oxidizing it and stripping it in hydrofluoric (HF) acid. One can also provide dielectric isolation of SiC devices on a wafer.

SUMMARY OF THE INVENTION

A semiconductor device employing at least one layer of a given conductivity porous silicon carbide (SiC).

DETAILED DESCRIPTION OF THE INVENTION

Figure 1:
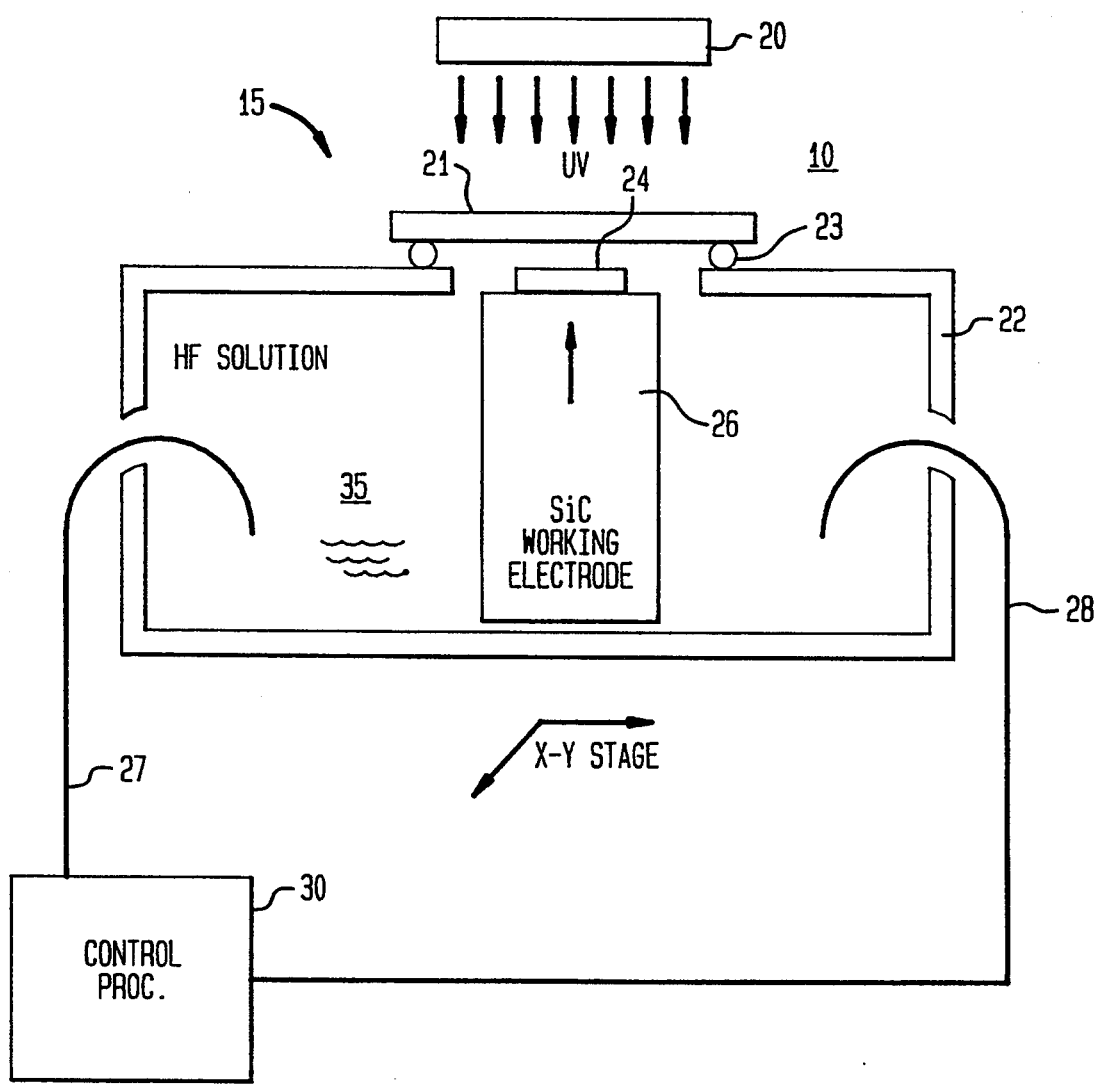
FIG. 1 is a diagram depicting a process for forming porous SiC utilizing an electrochemical cell.

Referring to FIG. 1, there is shown apparatus which can be used to form porous SiC. The formation of porous SiC occurs under electrochemical anodization. There are wide variety of fabrication conditions that result in pore formation, and the microstructure, pore size, pore spacing and morphology of the material is dependent on the process parameters. Referring to FIG. 1, there is shown an electrochemical cell 22. The cell 22 may be fabricated from an electrolyte-resistent, dielectric material, such as Teflon plastic material (trademark of Dupont Company). The cell 22 has a lead 27 which is a platinum wire counter-electrode and a lead 28 which is a saturated calomel reference electrode. Both leads are directed to a control processor apparatus 30 to control the entire process as will be explained. The cell 22 contains a electrolyte 35. The electrolyte 35 used in cell 22 may be a hydroflouric acid (HF) solution which is relatively dilute, as for example a 2.5% HF or any other acidic solution containing F or Br ions otherwise capable of dissolving $SiO_2$. A semiconductor wafer such as n-type 6H-SiC samples are contacted electrically with nickel ohmic contacts and are placed in a carrier 24 which carrier is as indicated placed within the electrochemical cell 22. The semiconductor sample is encapsulated in black wax so that only the bare semiconductor surfaces are exposed as the ohmic contacts and the leads are protected. Thus as seen in FIG. 1, the semiconductor wafers are positioned and mounted in the carrier module 24 which is positioned on the top surface of a pedestal 26 which is located in the cell 22. The semiconductor acts as the working electrode in this arrangement. Care must be taken, that all surfaces not to be etched, which may corrode in the electrolyte, must be covered with the black wax or other encapsulant. The semiconductor SiC is preferably biased with respect to the saturated calomel reference electrode 28 at a suitable potential for the n-type layer to photo corrode. The bias voltage is provided to the control processor 30. In this embodiment an anodic potential is applied to the semiconductor. In the case of n-type SiC, ultraviolet or UV light from source 20 illuminates the sample surface in order for dissolution to occur. The light is directed through a sapphire window 21 where it impinges upon the surface of the semiconductor supported by the carrier 24. In p-SiC, dissolution can occur in the dark. The depth of the porous layer and its structure is determined by the anodization time, the UV light intensity, the applied potential, the pH and the doping levels of the crystals. As indicated, the semiconductor is subject to electrochemical etching in the electrolyte 35, preferably while being exposed to UV light. UV light is provided from the UV light source 20 through the light transmissive cover 21 sealed to the top of the cell 22 by means of seals 23. The UV exposure generates holes in the semiconductor in the area which is exposed by the ultraviolet light. In any event, for a more detailed description of anodic dissolution of SiC, see the above-noted application which was filed on Oct. 16, 1991 entitled METHODS FOR ETCHING OF SILICON CARBIDE SEMICONDUCTOR USING SELECTIVE ETCHING OF DIFFERENT CONDUCTIVITY TYPES, Ser. No. 07/777,157. Again referring to FIG. 1, it is indicated that pore formation will occur under the following process conditions. For n-type 6H-SiC the anode potential is equal to 0-2 $V_{sce}$ (sce=saturated calomel electrode) which is applied by the control processor 30. The UV intensity from light source 20 is maintained between 50-500 mW/cm$^2$. The UV wavelength is selected in the range of 250-400 nanometers. The carrier concentration of the silicon carbide wafer is $3 \times 10^{18}/cm^3$. The concentration of the HF solution 35 is equal to 2.5% in water. In order to obtain porous p-type silicon for p-type 6H-SiC, the anodic potential is equal to 1.8 to 2.8 $V_{sce}$ the carrier concentration is equal to $2-3 \times 10^{18}/cm^3$ and the HF concentration is equal to 2.5% in water. The conditions for porous film formation are not limited to those delineated above, but pore formation has been directly observed under the above conditions. It should be noted that the potential of pore formation in n-SiC is lower than that of p-SiC. Therefore, a porous layer can be formed on a pn junction, such that the n-SiC side of the junction becomes porous and the p-SiC is unaffected. This can also be accomplished in reverse by anodizing the p-SiC between 1.8-2.8 $V_{sce}$ in the absence of UV, such that the p-SiC becomes porous and the n-SiC is unaffected.

Figure 2:
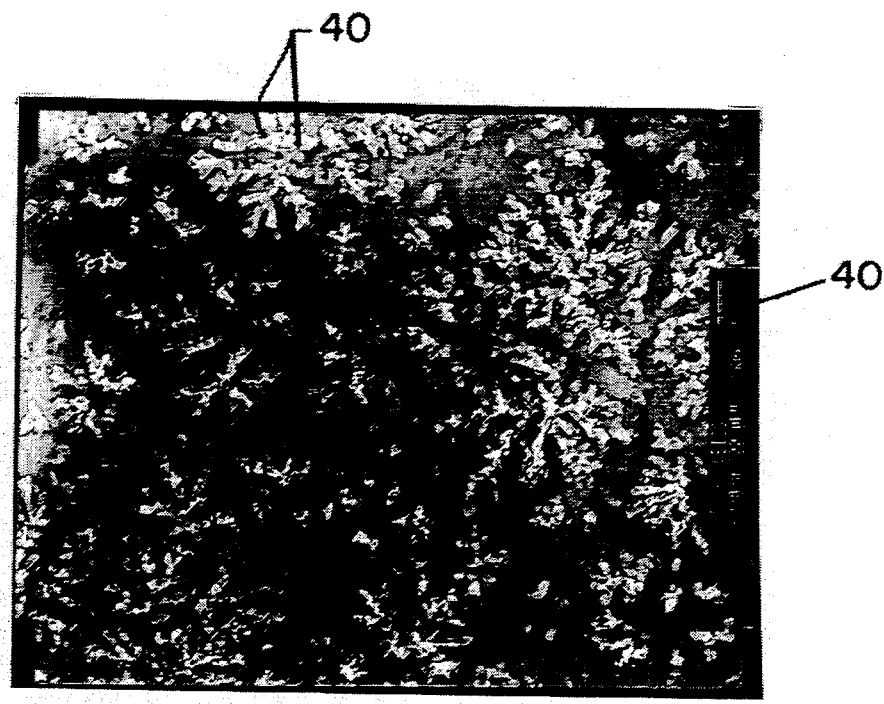
FIG. 2 is a top plan view transmission electron micrograph of a porous SiC layer formed by the process described in FIG. 1.

Referring to FIG. 2, there is shown a top plan view transmission electron micrograph of a porous SiC layer formed in a n-type 6H-SiC at V=1.4 $V_{sce}$ $_{I=300}$ mW/cm$^2$ of UV (250–400 nm), and $N_d$=3×10$^{18}$ cm$^3$ in 2.5% HF. The bright areas 40 are voids or pores in the SiC. The spacing between these pores range between about 5 nm to 100 nm. This indicates that both quantum features (less than 10 nm) and enlarged features can be fabricated. The pore size, shapes and spacings are very much a function of the processing conditions. Electron diffraction of the porous areas prove that the material is single crystal 6H-SiC. Thus, as one can ascertain from the micrograph of FIG. 2, one can produce porous SiC as disclosed therein and according to the above-noted process. In any event, porous SiC has the potential to be utilized as a UV generation medium in light emitting diodes (LED's) and laser diodes. Such devices would be extremely useful in optical storage, optoelectronic communication systems, laser bumping systems, sensor/detectors and materials processing. It is anticipated that such devices may emit light in the UV wavelength.

Semiconductor optoelectronics has, by and large, been limited to III-V compounds due to their direct band-gap. However, recent reports on porous Si have indicated that the material may be useful for optical devices. Band-gap widening and direct gap transitions have been attributed to quantum size pores and may be the cause of the visible luminescence that has recently been observed in porous silicon. For SiC, a porous structure could increase its already wide band-gap (3 eV for 6H-SiC) and allow direct gap transitions, which would enable efficient UV/near UV luminescence. These luminescent properties could be used in an LED or a Laser, thus greatly enhancing current optoelectronic capabilities by including deeper wavelengths in semiconductor light sources.

SiC has unique optical properties, such as blue electro-luminescence, which have facilitated the development of blue LED's. However, due to the indirect band-gap of SiC (3 eV for 6H-SiC), the LED's are inefficient. By electrochemically fabricating a microcrystalline porous structure in SiC, it may be possible to increase both the band-gap and quantum efficiency, resulting in UV or deep blue luminescence. This luminescence will enable the development of semiconductor UV sources and UV optoelectronic devices from porous SiC.

Laser diodes and LED's have been used extensively in a wide diversity of applications ranging from displays to optical communication systems. Porous SiC UV sources will extend the wavelength capability of this device below the blue wavelengths currently available from single crystal SiC and ZnSe. Such light sources could be useful in a variety of applications. For example, UV sources would enable a smaller spatial volume in optical recording, thus enhancing both spatial resolution and information packing densities in optical storage. UV LED's and lasers are also useful for optical communications and as higher energy pump sources for LASER's and possibly phosphors.

Currently, efforts are underway to develop direct band gap materials with large band gaps, such as GaN, AlN and ZnSe, which have band gaps between 3.2–6.4 eV for UV and near UV optoelectronics. A microcrystalline SiC structure would be useful in applications for which the other wide gap materials being investigated. SiC has much more sophisticated device technology associated with it than these other materials and thus offers considerable advantages over these other materials.

SiC is a very difficult material to pattern into device structures because of its chemical inertness. By selectively fabricating a porous layer into a silicon wafer, oxidizing the layer and removing the oxide in HF, deep etched features can be patterned.

Figure 3:
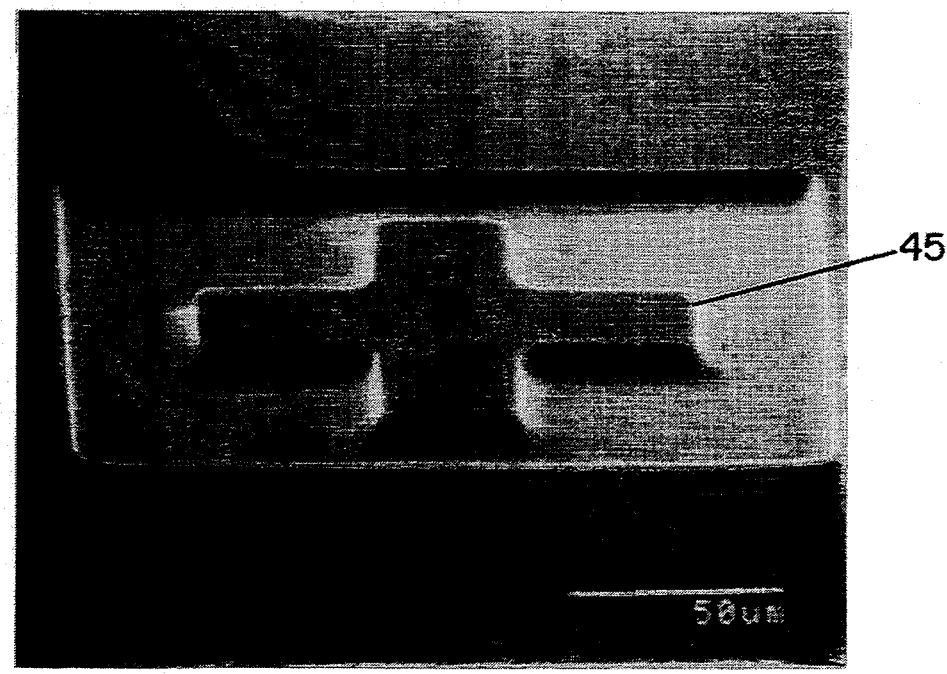
FIG. 3 is a top plan view electron micrograph of a pattern etched into a layer of SiC.

Referring to FIG. 3, there is shown a SEM micrograph of a pattern etched into n-type 6H-SiC. A metal mask was deposited on the SiC provided as described above, and patterned using standard photolithographic processes. The etching conditions were I=500 mW/cm$^2$ of UV (250–400 nm), V=1.5 $V_{sce}$ 2.5% HF for 30 minutes. The mask was subsequently removed and the SiC was thermally oxidized in a steam ambient for 4 hrs. at 1150° C. to fully oxidize the porous layer, and form a thin oxide (<1000 Å) on the parts of the surface previously covered by the metal. The oxide was etched for 2 min in buffer HF, resulting in the pattern 45 formed on the SiC.

Figure 4:
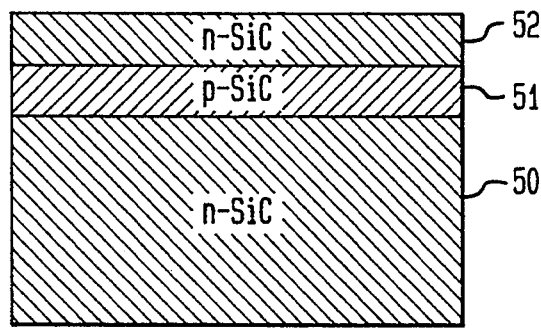
FIGS. 4-7 depict various steps in employing SiC to form a diode device according to this invention.
Figure 5A:
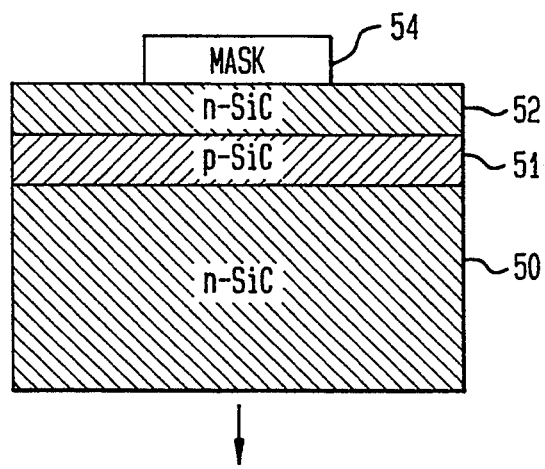
Figure 5B:
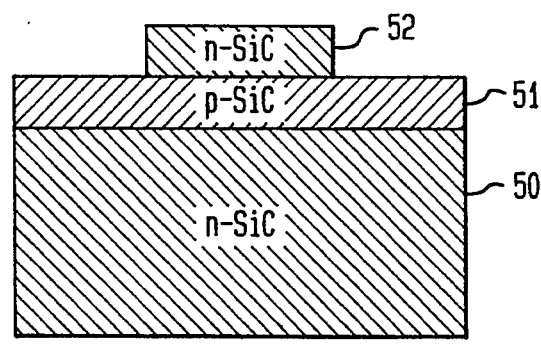
Figure 6:
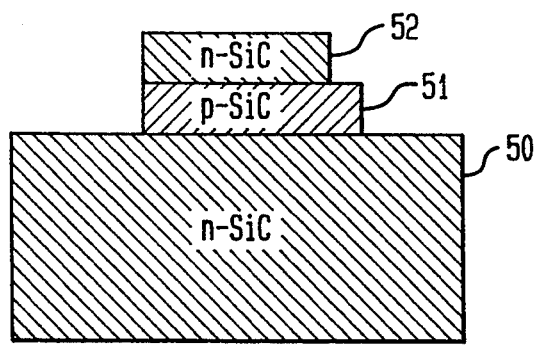
Figure 7:
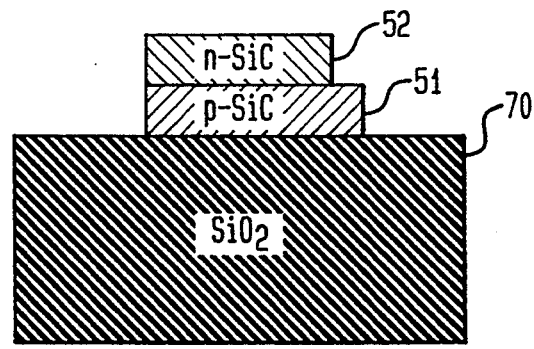

The following steps exhibit how porous SiC can be used to dielectrically isolate SiC devices. In this case the device described is a pn-junction diode, but the principles are equally applicable to other devices as well. Referring to FIG. 4, one proceeds with an n-SiC wafer 50, two epilayers, one p-type 51 and one n-type 52 are grown by chemical vapor deposition. In FIG. 5a, and 54 in placed on the top n-type epilayer 52 and defined using photolithography. In FIG. 5b, the n-SiC layer 52 is etched by forming a porous layer, oxidizing and HF dipping resulting in the mask pattern being transferred into the n-SiC. In FIG. 6, the p-SiC layer 51 is patterned in a similar manner. In FIG. 7, the bottom n-SiC 52 becomes porous and p-SiC 51 remains inert. The top n-SiC epilayer does not come into contact with the solution. The porous layer is then oxidized, resulting in a dielectrically isolated pn-junction. The p-n junction is comprised of single crystal SiC layers.

As one can ascertain, the techniques described above can be implemented by many different proceudres as briefly alluded to. Reference is again made to U.S. patent application No. 07/694,490 entitled HIGH TEMPERATURE TRANSDUCER AND METHODS OF FABRICATING THE SAME EMPLOYING SILICON CARBIDE, filed on May 2, 1992 and assigned to assignee herein. In that application, a pertinent reference was cited and entitled GROWTH AND CHARACTERIZATION OF CUBIC SiC SINGLE CRYSTAL FILMS ON SILICON by J. Anthony Powell et al., published in the Journal of Electrochemical Society, Solid States Science and Technology, June 1987, Volume 134, No. 6, Pages 1558–1565. This article contains an extensive bibliography and approaches using SiC in various applications and in the processing of SiC. As is well know, one can grow silicon carbide of either n or p-type by means of chemical vapor deposition techniques (CVD). Such techniques are well known for growing silicon carbide on silicon wafers, see for example the above-noted article. The doped gas employs tri-methyl aluminum. In a similar manner, the growth of silicon carbide layers on n-type silicon carbide is also known and can be accomplished by conventional CVD techniques. There are various articles in the prior art which teach the growth of films of silicon carbides. See for example an article by J. A. Powell, L. G. Matus and M. A. Kuczmarski in the Journal of the Electrochemical Society, Volume 134, Page 1558 (1987). See also an article by L. G. Matus, J. A. Powell, C. S. Salupo, Applied Physics Letters, Volume 59, Page 1770 (1991). Such articles, as well as the above-noted applications, teach the growth of layers of silicon carbide utilizing either p or n-type silicon carbide on silicon wafers or wafers of silicon carbide. In any event, such techniques employ standard masking techniques as for example, standard photolithagraphic processes which are also well known in the art.

Thus, there is described at least one useful device utilizing porous SiC, but many other devices are in fact contemplated. There is described a method and technique for the formation of porous SiC, a material that can have wide spead utility. The material as well as the process, will enable the formation of various devices with great potential use.

What is claimed is:

1. A method of fabricating porous SiC comprising the steps of:
    placing a wafer of silicon carbide in an electrochemical cell; and
    electrochemically etching said wafer for a period sufficient to form a porous layer on an exposed surface of said wafer.

2. The method according to claim 1, wherein said wafer is n-type SiC.

3. The method according to claim 2, wherein the carrier concentration of the n-type SiC is about $3 \times 10^{18}/cm^3$.

4. The method according to claim 5 further including the step of:
    illuminating said exposed surface of said wafer with ultraviolet (UV) light.

5. The method according to claim 4, wherein the intensity of said UV light is between 50–500 mW/cm$^3$ and the wavelength is between 250–400 nanometers.

6. The method according to claim 1 wherein said wafer is p-type SiC.

7. The method according to claim 6, wherein the carrier concentration of the p-type SiC is between 2 to $3 \times 10^{18}/cm^3$.

8. The method according to claim 1, wherein said step of electrochemically etching includes applying an anodic potential to said wafer in said cell.

9. The method according to claim 1, wherein said etching employs hydrofluoric acid (HF).

10. The method according to claim 9, wherein said HF is 2.5% in water.

11. A method of fabricating porous SiC comprising the steps of:
    placing a wafer of silicon carbide in an electrochemical cell; and
    electrochemically etching said wafer by applying an anodic potential to said wafer via a saturated reference electrode, for a period sufficient to form pores on an exposed surface of said wafer, wherein said potential is between 0–3 volts at the saturated reference electrode.

* * * * *